United States Patent [19]
Earl et al.

[11] Patent Number: 5,437,561
[45] Date of Patent: Aug. 1, 1995

[54] SELF-LOCKING TAB

[75] Inventors: George F. Earl, Meredith; Jack Churchill, Laconia; Jeffrey J. Panek, Laconia; Allen F. Hillman, Jr., Laconia, all of N.H.

[73] Assignee: Aavid Engineering, Inc., Laconia, N.H.

[21] Appl. No.: 283,216

[22] Filed: Jul. 29, 1994

Related U.S. Application Data

[63] Continuation of Ser. No. 227,581, Apr. 14, 1994, abandoned, which is a continuation of Ser. No. 136,491, Oct. 14, 1993, abandoned, which is a continuation of Ser. No. 63,114, May 17, 1993, abandoned, which is a continuation of Ser. No. 978,198, Nov. 18, 1992, abandoned, which is a continuation of Ser. No. 804,804, Dec. 9, 1991, abandoned.

[51] Int. Cl.⁶ .......................................... H01R 13/60
[52] U.S. Cl. ................................... 439/567; 439/487
[58] Field of Search .............. 439/83, 89, 487, 557, 439/567, 571; 24/215

[56] References Cited

U.S. PATENT DOCUMENTS

| | | | |
|---|---|---|---|
| 2,077,120 | 4/1937 | Lombard | 24/213 |
| 2,169,708 | 8/1939 | O'Callaghan | 24/213 |
| 4,142,810 | 3/1979 | Lesaint | 439/557 X |
| 4,865,555 | 9/1989 | Assini et al. | 439/567 X |
| 4,943,244 | 7/1990 | Teck et al. | 439/567 |
| 5,024,607 | 6/1991 | Kachlic | 439/567 |
| 5,085,589 | 2/1992 | Kan | 439/607 X |
| 5,104,339 | 4/1992 | Verhoeven | 439/567 |
| 5,108,312 | 4/1992 | Sampson | 439/567 X |
| 5,171,165 | 12/1992 | Hwang | 439/567 |

OTHER PUBLICATIONS

Aavid ™ Thermal Management Catalog 1200, 1989, pp. 1–112.

Primary Examiner—Eugene F. Desmond
Attorney, Agent, or Firm—Fish & Richardson

[57] ABSTRACT

A connector for attaching a heat sink or other device to a circuit board comprising an attachment portion for connecting to the device, the attachment portion having a pair of legs, each with a projection on its end, the legs being spring-biased so that once the projections pass through the hole, the projections expand and engage the surface of the board or edges of the holes opposite the device.

5 Claims, 3 Drawing Sheets

SELF-LOCKING TAB

This is a continuation of application Ser. No. 08/227,581, filed Apr. 14, 1994, now abandoned, which is a continuation of application Ser. No. 08/136,491, filed Oct. 14, 1993, which is abandoned, which is a continuation of application Ser. No. 08/063,114, filed May 17, 1993, which is abandoned, which is a continuation of application Ser. No. 07/978,198 filed Nov. 18, 1992, which is abandoned, which is a continuation of application Ser. No. 07/804,804 filed Dec. 9, 1991, now abandoned.

FIELD OF THE INVENTION

This invention relates to the field of heat sinks and in particular to the devices used to attach heat sinks to printed circuit boards.

BACKGROUND OF THE INVENTION

It is well known that semiconductor devices generate a great deal of heat when in use, and as a result, it is often necessary to attach the semiconductor to a heat sink, which can dissipate that heat. The heat sink may also be connected to the printed circuit board as well as the semiconductor. In many cases, the heat sink is soldered to the printed circuit board in order to hold it in place. Other types of attachment means are also used.

A principal problem is that connecting heat sinks to printed circuit boards is often labor-intensive. The connectors in the prior art are often difficult to work with. They also are relatively expensive. In addition, many of the prior art connectors in use today do not actually seat the heat sink securely in the printed circuit board. One type of prior art connector is a metal tab, which is essentially flat. A portion of the tab is connected to the heat sink, and a flat, projecting piece is arranged to fit into a hole on a circuit board to which it is soldered. The drawback with this type of connector is that in order to solder it in place, the heat sink usually must be held by hand, as the connector may slip out of the hole otherwise. This makes soldering by an automatic machine process difficult, if not impossible, in some cases. The same problem exists when replacing the heat sink after the solder has been removed.

Accordingly, one object of this invention is to provide a connector for attaching a heat sink or other similar device to a board, which connector is easy to attach the heat sink and, when attached to the heat sink, easy to attach to the printed circuit board or the like.

Another object of the invention is to provide a connector for attaching a heat sink or similar device to a board, which connector is inexpensive.

Another object of the invention is to provide a connector for attaching a heat sink or similar device to a board, which connector securely attaches the heat sink or other device prior to soldering to the board without the need for any other type of attachment means.

Another object of the invention is to provide a connector for attaching a heat sink or similar device to a board, which connector can be easily removed after any solder has been removed.

SUMMARY OF THE INVENTION

The invention here comprises a connector having at least one extension with a projection so that when the connector is attached to a heat sink or other similar device, the extension fits at least in part through a hole in a board to which the device is to be attached, and a spring-biasing effect created by the extension and the remainder of the connector holds the extension securely against the side of the hole while the projection, which has passed through the hole and is on the opposite side of the board from the remainder of the connector, is biased so as to prevent the extension from pulling out of the hole.

In the preferred embodiment, a connector is disclosed having an upper section comprising a single, thin piece of brass or steel, which is folded over onto itself. There is a rectangular attachment hole disposed through the upper section for use in attaching the connector to a heat sink or other device to be connected to a board. A pair of extensions are disposed adjacent to each other, extending from the upper section of the connector. Each extension has a projection on its end opposite the upper section. In use, after the connector has been attached to the heat sink or other device, the extensions, with their projections which are disposed opposite each other, are inserted into the hole on the board to which the heat sink or other device is to be attached. The projections and to some degree the extensions themselves are compressed together by the sides of the hole in the board into which they are inserted. Once the projections have passed through the hole and are on the other side of the board, the projections spring apart. The extensions in the hole contact the sides of the hole, and as the projections extend beyond the sides of the hole on the other side of the board, the connector is held to the board. It can be removed, however, by compressing the projections together so that they will once again fit through the hole. This may be necessary if the heat sink or any semiconductor device attached to it needs to be replaced.

In another embodiment of the invention, a pair of connectors may be used, each having a single extension and projection. In this embodiment, one connector is attached to one side of the heat sink while a second connector is attached to the opposite side. When the heat sink is connected to the board, the two separate extensions with their projections are inserted into two separate holes in the board. As before, the spring action of the projections, once they are through the holes, secures the heat sink to the board.

DESCRIPTION OF THE PREFERRED EMBODIMENT

We turn now to a detailed description of the preferred embodiment, after first describing the drawings.

STRUCTURE

Figure 1:
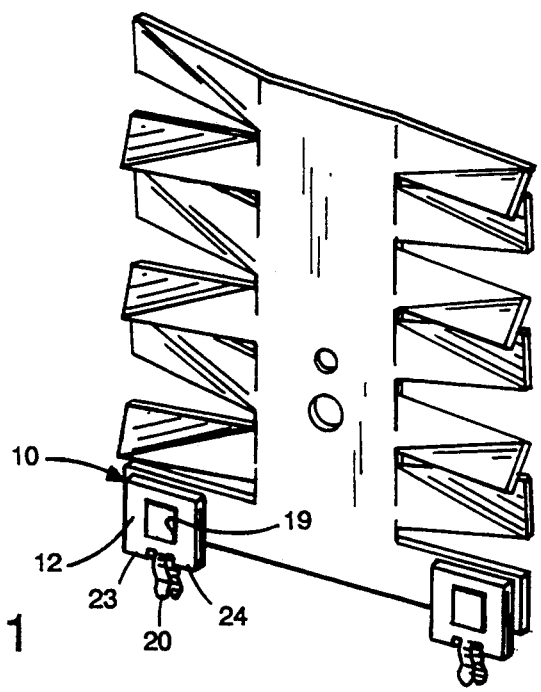
FIG. 1 is a perspective view of the connector of the preferred embodiment attached to a heat sink.
Figure 2:
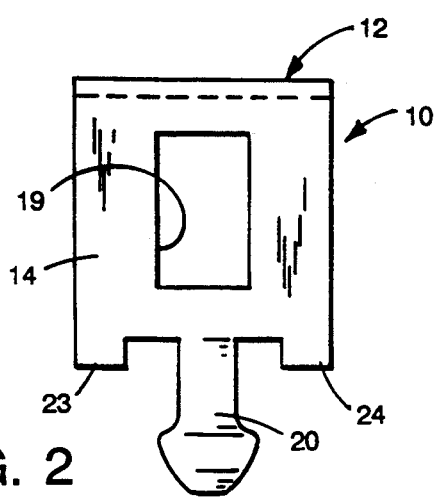
FIG. 2 is a front view of the connector of the preferred embodiment.
Figure 3:
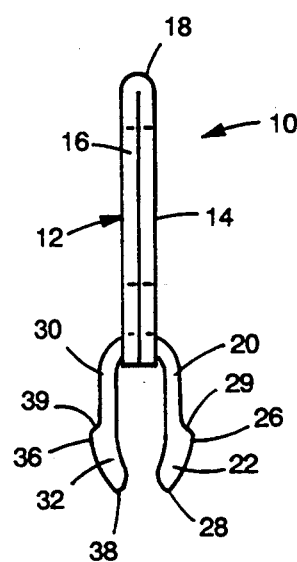
FIG. 3 is a side view of the connector of FIG. 3.

Referring to FIGS. 1, 2 and 3, a connector according to this invention is shown at 10. The connector 10 generally comprises an upper section 12 and a pair of extensions 20, 30. As shown best in FIG. 3, the extensions 20, 30 are disposed parallel to each other, but are spaced apart. Each extension 20, 30 has a projection 22, 32 at its end opposite the upper section 12 of the connector 10.

In the preferred embodiment, the upper section 12 of the connector 10 comprises a single piece of metal which is folded over to form a package having a first side 14 and a second side 16. The sides 14, 16 are identical, and they are connected together along a fold 18, which in the preferred embodiment is along the top. The fold 18, however, could be along either side. It is also possible to make the upper section 12 in a single piece or from two separate pieces which are joined together. As shown in FIG. 2, the upper section 12 has a rectangular opening 19 therethrough. The size and shape of the opening 19 depends upon the device to which the connector 10 is to be attached. At the end of the upper portion 12 opposite the fold 18, there are a pair of legs 23, 24. The connector 10 itself may be made of light gauge brass, beryllium copper, steel (1070 to 1090) or phosphor bronze. Other materials are also possible. However, the material should be available in thin sheets, should be springy and should be solderable.

The extensions 20, 30 are integral with the upper section 12. As best shown in FIGS. 2 and 3, the extensions 20, 30 begin at the midpoint between the legs 23, 24 and extend away from the upper section 12 in a plane generally parallel to that of the sides 14, 16. Extension 20 is integral with the first side 14, while extension 30 is integral with the second side 16. The projection 22 on the end of the extension 20 is essentially a concave spade with a curved outer surface 26. The projection 20 is tapered so that it ends at a point 28. The curved surface 26 has a lip 29 opposite the point 28. The lip 29 is disposed at nearly a right angle to the extension 20 in the preferred embodiment, but other angles are possible, including much less severe angles. The other projection 32 is identical, with a curved outer surface 36, a point 38 and a lip 39.

Figure 5:
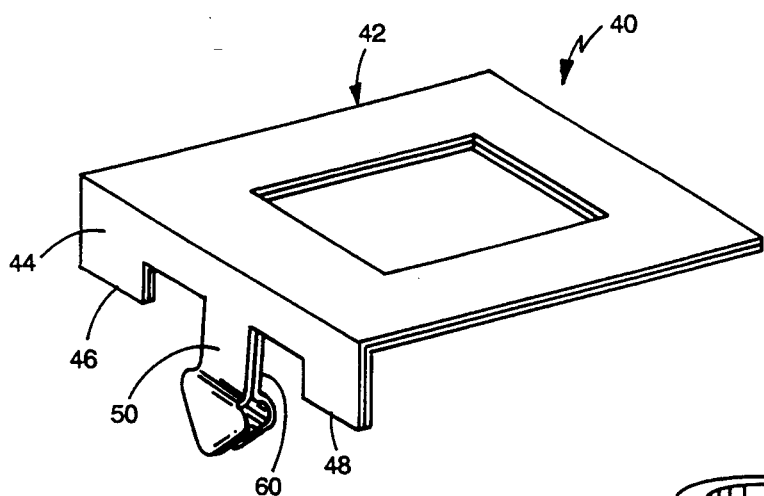
FIG. 5 is a perspective view of an alternate arrangement of the connector of the preferred embodiment.
Figure 6:
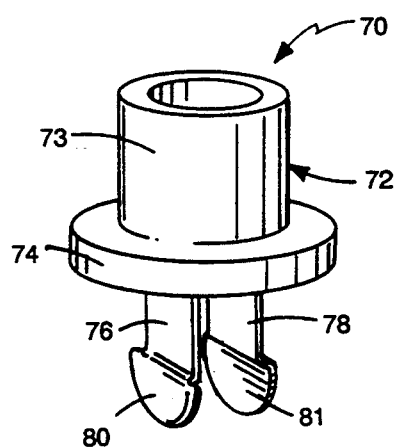
FIG. 6 is a perspective view of a second alternate arrangement of the connector of the preferred embodiment.

As shown in FIGS. 5 and 6, variations on the structure of the preferred embodiment are possible. In FIG. 5, a connector 40 is shown. The connector 40 has an upper section 42 with the same basic structure as that in FIGS. 1-3. The connector 40, however, has a surface 44 which is disposed at a right angle to the upper section 42. The surface 44 has a pair of legs 46, 48 and a pair of extensions 50, 60 extending therefrom. The legs 46, 48 and the extensions 50, 60 (which are identical to those extensions 20, 30 of FIGS. 1-3) are disposed in a plane generally parallel to the surface 44 and thus at an angle of about 90 degrees to the upper portion 42. Such an arrangement may be necessary depending upon the configuration of the heat sink (or other device) and the board or device to which it is to be attached. This may be the result of space requirements in the assembled device as well. It should be understood, however, that other angles are possible and perhaps desireable depending upon the configuration of the heat sink and board.

Referring to FIG. 6, an alternate connector 70 is shown. Some heat sinks and other devices are attached to boards by means of eyelets. The connector 70 includes an eyelet 72, which is essentially a cylinder 73 with a flange 74 at one end. The cylinder 73 fits into a heat sink or other device, and it is usually held in place by a force fit. As shown in FIG. 6, a pair of extensions 76, 78 extend downwardly from the end of the eyelet 72 with the flange 74. The extensions 76, 78 are identical to the extensions 20, 30 of FIGS. 1-3, and they have projections 80, 81 which are identical to projections 22, 32 of FIGS. 1-3. The connector of FIG. 6 would be used where the heat sink or other device to be attached required an eyelet type connector. Of course, other heat sinks or devices could require still other types of connectors to which this invention could be applied. This invention is not limited to the types of connectors shown herein.

Operation

Figure 4A:
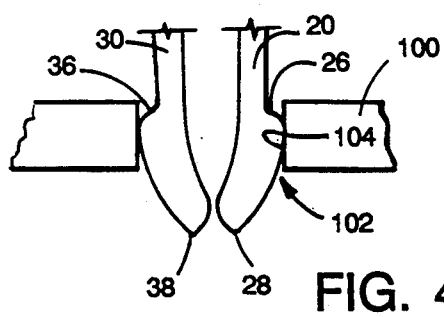
FIGS. 4A and 4B are enlarged views of the connector of the preferred embodiment as it is installed in a board.
Figure 4B:
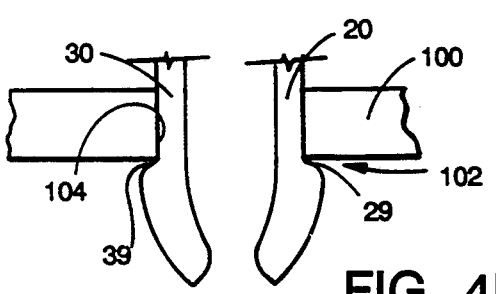

The operation of the connector 10 (and also of the connectors 40, 70) is as follows. The connector 10 is attached to the device which is going to be used to connect to a board. As shown in FIG. 1, a heat sink 90 is one possibility. Others could be baffles, stiffeners or handles. Other devices are also possible. Once attached (and more than one connector 10 may be connected to a particular device as shown in FIG. 1), the connector 10 may be inserted into a board such as the printed circuit board 100, as shown in FIGS. 4A and 4B. Specifically, the extensions 20, 30 are aligned with a hole 102 in the board 100. The hole 102 has a side 104. The projections 22, 32 slide into the hole 102. This is made relatively easy by the points 28, 38 and the curved outer surfaces 26, 36. The projections 22, 32 are too wide for the hole 102. Consequently, as they are inserted, the side 104 of the hole 102 acts to compress the projections 22, 32 and the extensions 20, 30 together. As the extensions 20, 30 are made from thin, springy metal in the preferred embodiment, this does not damage or permanently deform either the extensions 20, 30 or the projections 22, 32.

As shown in FIG. 4B, the extensions 20, 30 are of a length so that the projections 22, 32 may pass through the hole 102 to the opposite side of the board 100. When this happens, the projections 22, 32 no longer are compressed by the side 104 of the hole 102, and they spring back to their normal position, which is shown in FIG. 4B. The projections 22, 32 are then disposed outside the hole 102 so that their lips 29, 39 contact the board 100. This locks the connector 10 to the board 100 unless the projections 22, 32 are compressed again so that the lips 29, 39 no longer contact the board, and the projections 22, 32 may once again slip into the hole 102. It will be appreciated that it is easy to insert the projections 22, 32 into the hole 102 in the first place because the points 28, 38 are easily inserted into the hole 102, and the curved outer surfaces 26, 36 of the projections make the necessary compression automatic. Consequently, insertion is accomplished by merely lining up the extensions 20, 30 with the hole 102 and pushing the connector 10 towards the board 100. The same is not true for removal. Because of the lips 29, 39, the projections 22, 32 must be compressed together first. Thus, while the connector 10 can be removed from the board, it is secured in place once it is inserted. As a result, the connector holds the heat sink in place by itself, and further processing, such as soldering, can be done automatically and without extensive labor. The operation of the alternate versions shown in FIGS. 5 and 6 is identical, as far as the locking mechanism of the extensions and projections are concerned.

Other Embodiments

Figure 9:
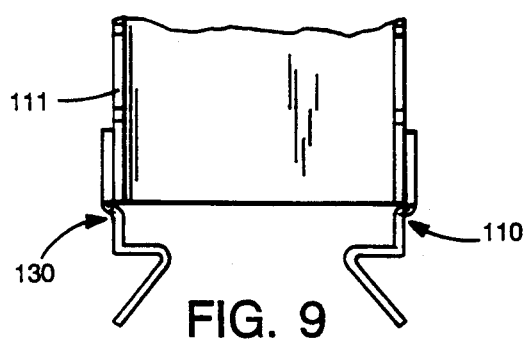
FIG. 9 is a view of an alternate arrangement for the connector of FIG. 7.
Figure 7:
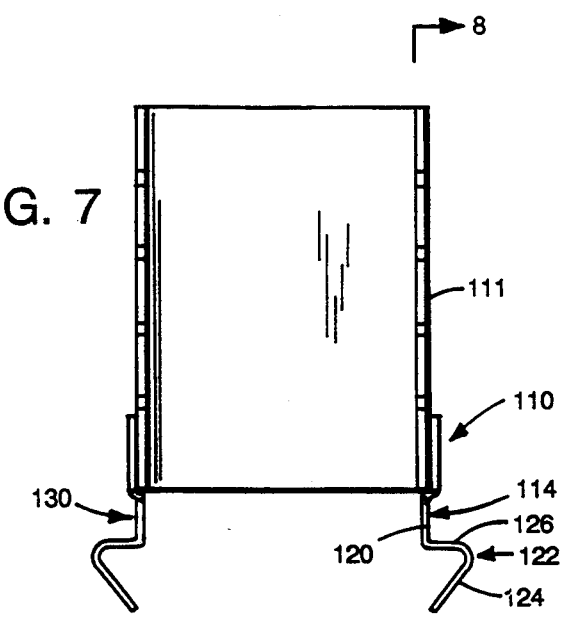
FIG. 7 is a view of another embodiment of the connector of this invention, as attached to a heat sink.
Figure 8:
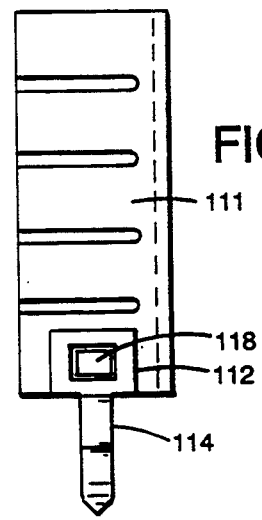
FIG. 8 is a view taken along lines 8—8 of FIG. 7.

Referring to FIGS. 7 and 8, another embodiment of the invention is disclosed. In that embodiment, a connector is shown at 110. The connector 110, which is attached to a heat sink 111 as in the preferred embodiment, comprises an upper portion 112 and an extension 114. As best shown in FIG. 8, the flat, upper portion 112 is adapted to be attached to a heat sink 111 or other device, and for that purpose, it has an opening 118 to receive the attachment knob 120 on the heat sink 111. The extension 114 is best shown in FIG. 7. The extension 114 comprises a leg 120 which terminates in a V-shaped projection 122. The projection 122 comprises a sloping surface 124 and a lip 126. The lip is at approximately a right angle to the leg 120. As shown in FIG. 7, the projection 122 is disposed that it extends outboard of the heat sink 111. An identical connector 130 is attached to the opposite side of the heat sink 111. In FIG. 9, the same connectors 110, 130 are shown connected to the heat sink 111 so that the projections are disposed inboard of the heat sink 111. There is no operational difference between the two arrangements, and other arrangements are possible. With either arrangement, the extensions are aligned with holes in the board (neither shown in these FIGS.), and the projections 122 slide into the holes compressing the connectors towards each other (FIGS. 7 & 8) or away from each other (FIG. 9). Once the projections are through the holes, they spring back to their original shape, and their lips lock the connectors in place.

Depending on the application, it is possible that only one of the connectors of FIGS. 8, 9 might be used, and it is possible that different types of upper portions 112 may be used. For example, the upper portion 112 may include an extension such as 114 used to lock it to the board. The connector 110 is also not limited to a single extension 112 but could include several to lock the connector to the board.

Figure 10:
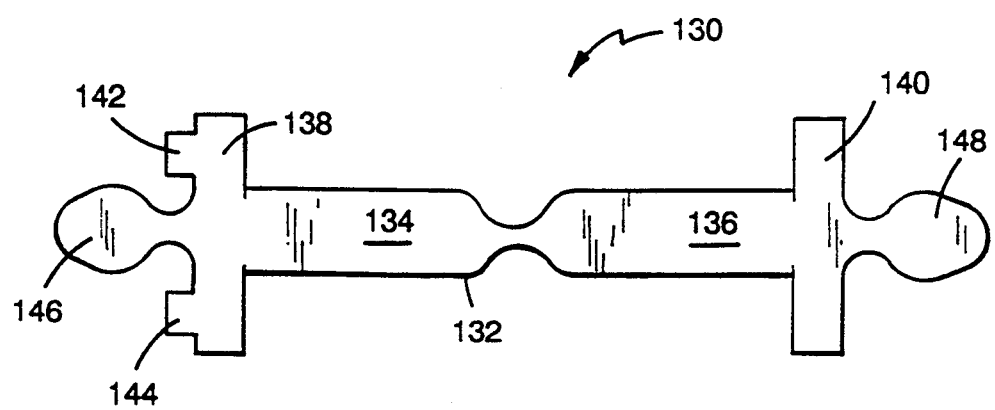
FIG. 10 is a view of another embodiment of the connector of this invention.
Figure 11:
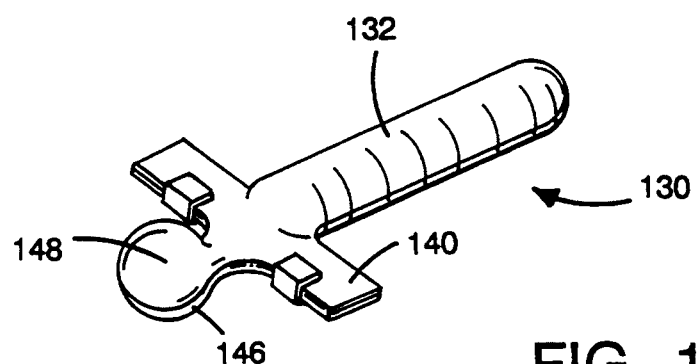
FIG. 11 is a perspective view of the embodiment of FIG. 10 when assembled.

As shown in FIG. 10, 11, another connector is shown at 130. The connector 130 includes an upper portion 132 comprising a pair of sides 134, 136. Both sides 134, 136 terminate in an end piece 138, 140. End piece 138 has a pair of legs 142, 144. Both end pieces have extensions 146, 148 identical to those extensions 20, 30 of FIGS. 1-3. FIG. 10 shows the unassembled connector 130 in the form of a flat blank, although the connector may be made from separate pieces. In FIG. 11, the assembled connector 130 is shown. The upper portion 132 has been formed by folding over the two sides 134, 136 and rounding them to form a cylindrical pin shape. Some existing heat sinks (not shown) have small holes to fit connector pins. The cylindrical upper portion 112 is designed to be inserted into such holes. Operationally, the connector 130 is the same as that of the embodiment of FIGS. 1-3.

Other arrangements will occur to those skilled in the art.

What we claim is:

1. A connector for attaching a heat sink to a printed circuit board comprising:
    an attachment means,
        said attachment means comprising a single, integral piece which is folded along a fold to form a first plate and a second plate, said plates being disposed adjacent to each other and contacting each other along their respective adjacent surfaces, at least one said plate having a means for connecting said plate to the heat sink, and
    extension means,
        said extension means comprising a first leg and a second leg, said first leg being integral with one end of said first plate and having a first projection with a first engagement surface at its opposite end, said second leg being integral with one end of said second plate and having a second projection with a second engagement surface at its opposite end, said legs being disposed adjacent to but apart from each other and being adapted to flex towards each other,
    whereby said connector holds the heat sink to the board by directing said first and second projections into a hole in the board so that said legs are compressed together and when said first and second projections have passed through said hole so that said attachment means is on the other side of the board, said legs flex back to a position whereby said first and second engagement surfaces contact the board opposite the heat sink thereby holding the heat sink to the board
    and at least one stand-off leg extending from at least one of said plates, which is adapted to engage the printed circuit board when said connector and the heat sink are in place.

2. The connector of claim 1 wherein said plates define an opening which extends therethrough and which is adapted to receive a portion of the heat sink.

3. The connector of claim 1 wherein each said engagement surface is a lip disposed at an acute angle to each said leg.

4. The connector of claim 1 wherein each said projection includes a curved surface, each said curved surface being disposed opposite each other.

5. The connector of claim 1 wherein said attachment means and said extension means are formed from a single piece of metal.

* * * * *